United States Patent [19]

Schwalke et al.

[11] Patent Number: 5,164,333

[45] Date of Patent: Nov. 17, 1992

[54] METHOD FOR MANUFACTURING A MULTI-LAYER GATE ELECTRODE FOR A MOS TRANSISTOR

[75] Inventors: Udo Schwalke, Williston, Vt.; Hellmut Joswig, Munich, Fed. Rep. of Germany

[73] Assignee: Siemens Aktiengesellschaft, Munich, Fed. Rep. of Germany

[21] Appl. No.: 692,692

[22] Filed: Apr. 29, 1991

[30] Foreign Application Priority Data

Jun. 19, 1990 [DE] Fed. Rep. of Germany ....... 4019538

[51] Int. Cl.[5] .................. H01L 21/283; H01L 21/335
[52] U.S. Cl. .................... 437/200; 437/41; 437/190; 437/192; 437/193
[58] Field of Search ............... 437/200, 793, 792, 41, 437/190; 357/71

[56] References Cited

U.S. PATENT DOCUMENTS

| | | | |
|---|---|---|---|
| 4,555,842 | 12/1985 | Levinstein et al. | 437/45 |
| 4,562,640 | 7/1986 | Widmann et al. | 148/DIG. 19 |
| 4,570,328 | 2/1986 | Price et al. | 437/192 |
| 4,640,004 | 2/1987 | Thomas et al. | 437/190 |
| 4,884,123 | 11/1989 | Dixit et al. | 357/71 |
| 4,897,368 | 1/1990 | Kobushi et al. | 437/200 |

FOREIGN PATENT DOCUMENTS 62-111466 5/1987 Japan .

OTHER PUBLICATIONS

Davari, B. et al., "A High Performance 0.25 μm CMOS Technology", *IEEE IEDM Tech. Digest* 1988, pp. 56–59.

Hayashida, H., et al., "Dopant Redistribution . . . ", *Conf. Proc. VLSI Symposium*, 1989, pp. 29–30.

Chapman, R. et al., "0.5 Micron CMOS . . . ", *IEEE IEDM Tech. Digest*, 1988, pp. 52–55.

Wong, C., et al., "Doping of N+ and P+ Polysilicon . . . ", *IEEE IEDM Tech. Digest*, 1988, pp. 238–241.

"Simplified Lightly Doped Drain Process", *IBM Technical Disclosure Bulletin*, vol. 30, No. 12, May 1988, pp. 180–181.

Burmester, R., et al., "Reduction of Titanium Silicide Degradation . . . ", *Conf. Proc. ESSDERC89*, pp. 233–236.

Alperin, et al., "Development of the Self-Aligned . . . ", *IEEE Trans. Elec. Dev.*, vol. ED-32, No. 2, Feb. 1985, pp. 141–149.

Heuberger, A., et al., "A Tin/TiSi$_2$ Interconnect . . . ", *Conf. Proc. ESSDERC* 89, pp. 645–648.

Kobushi, et al., "A High Integrity and Low Resistance . . . ", *Japanese J. App. Phys.*, 27(11), Nov. 1988, pp. L2158–L2160.

Joshi, et al., "Novel Self-Aligned W/Tin/TiSi$_2$ Contact", *Appl. Phys. Lett.* 54(17), Apr. 24, 1989, pp. 1672–1674.

Jones, N. J., et al., "Salicide with Buried Silicide Layer", *IBM Tech. Disc. Bull.*, 27(2), Jul. 1984, pp. 1044–1045.

Ho, P. S., et al., "General Aspect of Barrier Layers . . . ", *Thin Solid Films*, 96 (1982), 301–316.

Primary Examiner—T. N. Quach
Attorney, Agent, or Firm—Hill, Van Santen, Steadman & Simpson

[57] ABSTRACT

A multi-layer gate electrode is provided to prevent dopant depletion of a polysilicon in the manufacture of the electrode containing doped polysilicon and metal silicide. First, a multi-layer structure is produced containing a doped polysilicon structure, a diffusion barrier structure and a silicon structure. After deposition of a metal layer covering the multi-layer structure, a metal silicide structure is produced from the silicon structure and the metal layer in a tempering process. The diffusion barrier structure thereby prevents diffusion of dopant out of the polysilicon structure into the metal silicide structure. This may be used in a salicide process.

7 Claims, 2 Drawing Sheets

METHOD FOR MANUFACTURING A MULTI-LAYER GATE ELECTRODE FOR A MOS TRANSISTOR

BACKGROUND OF THE INVENTION

1. Field of the Invention

The present invention is directed generally to a method for manufacturing a multilayer gate electrode containing doped polysilicon and metal silicide in a MOS transistor.

2. Description of the Related Art

In CMOS technology, simultaneous silicidation of gate regions and source/drain regions is gaining in significance. The reduction in sheet resistivity and contact resistance of the gate electrode, as well of the source/drain terminals, that is thereby achieved contributes to an improvement in transistor performance. This method is referred to as the SALICIDE process (or self aligned silicide) and is known, for example form a publication by M.E. Alperin et al., "Development of the Self-Aligned Titanium Silicide Process for VLSI Applications", IEEE Transactions on Electron Devices, Vol. ED-32, no. 2, p. 141-149 (1985). According to this reference, a metal, such as titanium, is deposited surface-wide on the surface of the source or the drain regions, as well as onto a doped polysilicon structure that is arranged above the gate oxide and that forms part of the gate electrode. When subject to designational tempering, a formation of silicide occurs on the exposed silicon surfaces; in other words, on the doped polysilicon structure as well as on the surface of the source/drain regions. By contrast, unreacted metal is preserved on the surfaces that are masked with an oxide or a nitride. The metal and the potential reaction products are removed with an etchant that selectively removes only the metal relative to the silicide. Thus, only the silicidated gate electrode and source/drain terminals remain.

A significant disadvantage of this method is that a dopant depletion occurs during the tempering process. In this context, dopant depletion refers to a flow-back of dopant out of the silicon regions into the silicide. This effect is especially pronounced in the doped polysilicon structure due to the rapid grain boundary diffusion.

The reason for the dopant depletion is that parasitic metal-to-dopant reactions occur simultaneously with the formation of the metal silicide. Stable metal-dopant compounds, such as $TiB_2$, are formed in this metal-to-dopant reaction.

When the dopant concentration in the doped polysilicon which forms part of the gate electrode falls below approximately $5 \times 10^{-19}$ cm$^{-3}$, in other words, when the doped polysilicon structure no longer contains degenerated doped polysilicon, then a space charge zone is formed in the gate electrode. This effect is referred to as gate depletion and is known, for example, from the publication by C.Y. Wong et al., "Doping of N+ and P+ Polysilicon in a Dual-Gate CMOS Process", Technical Digest IEDM 88, pages 238 through 241 (1988).

In an article by R.A. Chapman et al., "0.5 Micron CMOS for High Performance at 3.3 V", Technical Digest IEDM 88, pages 52 through 55 (1988), it is known that the dopant depletion in the doped polysilicon structure causes a reduction of the saturation drain current. It also deteriorates the below threshold behavior.

The dopant depletion also leads to changes in the electron affinity and, thus, to shifts in the cutoff voltage.

In the publication by H. Hayashida et al., "Dopant Redistribution in Dual Gate W-Polycide CMOS and its Improvement by RTA", Conference Proceedings VLSI Symposium, pages 29-30 (1989) and in a publication by B. Davari et al., "A High Performance 0.25 µm CMOS Technology", Technical Digest IEDM 88, Pages 56-59 (1988) is disclosed measures which attempt to suppress the dopant depletion.

In the foregoing Hayashida et al. reference, it is disclosed that the dopant depletion can be influenced by a limitation of the annealing temperature budget. The reduction of the temperature budget, however, means a significant limitation in the process management. Only slight improvements with respect to the dopant depletion can be achieved with this measure, so that the limitation of the process management involved here does not seem justifiable.

In the D. Davari et al. reference cited above is disclosed that the dopant depletion may be influenced by a reduction of the silicide thickness. A reduction in the silicide thickness, however, leads to reduction in the conductivity of the gate electrode. Over and above this, the temperature stability of this silicide is also deteriorated (see further the publication by R. Burmester et al., "Reduction of Titanium Silicide Degradation During Borophosphosilicate Glass Reflow", Conference Proceedings ESSDERC 89, pages 233-236 (Springer Verlag, 1989, edited by Heuberger, Ryssel, Lange)).

SUMMARY OF THE INVENTION

It is an object of the present invention to provide a method for silicidation of a gate electrode containing doped polysilicon which avoids dopant depletion of the polysilicon and is also simultaneously compatible with a SALICIDE process.

This and other objects and advantages of the invention are achieved by a method for manufacturing a multi-layer gate electrode containing doped polysilicon and metal silicide in a MOS transistor which incorporates the following steps:

a) Generating a multi-layer structure on a substrate provided with a gate oxide, the structure being generated at a location prescribed for the multi-layer gate electrode, the multi-layer structure including a doped polysilicon structure on the substrate, a diffusion barrier structure being on the doped polysilicon structure and a silicon structure being on the diffusion barrier structure;

b) Producing spacers at the side walls of the multi-layer structure;

c) Applying a metal layer to the substrate having a multi-layer structure;

d) Producing a metal silicide from the metal layer and the silicon structure with a temperature treatment; and e) Producing the diffusion barrier structure of a material that prevents a diffusion out of the polysilicon structure into the metal silicide structure.

In the method of the present invention, the metal silicide structure is formed of the silicon structure and of the metal layer arranged thereabove. The doped polysilicon structure is separated from the metal layer by the diffusion barrier structure and by the silicon structure. Since the diffusion of dopant from the polysilicon structure in the direction of the metal layer is prevented by the diffusion barrier structure, a metalto-dopant reaction which would cause a dopant depletion cannot occur during the tempering process.

As a particularly suitable material for the diffusion barrier structure, TiN is preferred. In addition to having a good electrical conductivity and thermal stability, even in an oxidizing temperature of up to approximately 950° C., TiN has an adequately good barrier effect. The barrier effect of the TiN barrier is further improved by a temperature treatment at, for example, 500° C.-700° C. or, for example, in a rapid thermal annealing (RTA) step following the deposition of the TiN material. Given use of the TiN layer as a diffusion barrier structure, conventional reoxidations, spacer technologies and source/drain temperings are possible as a result of the good temperature stability of this material.

The manufacturing method of the present invention is compatible with the traditional SALICIDE process. In a SALICIDE process, the metal layer is applied so that it is simultaneously covering the multi-layer structure and the prescribed locations on the substrate for a source terminal and for a drain terminal. The source and drain regions are previously produced by implantation or by diffusion by using either an externally aligned or a self-aligned mask. The multi-layer structure is suitable for use as a self-aligned mask. In the tempering step, the source and drain terminals then form from the metal layer where the metal is in contact with the silicon surface of the source or drain region.

Further developments of the invention include applying the metal layer so that it simultaneously covers the multi-layer structure and prescribed locations on the substrate for a source terminal and a drain terminal. This process may be further characterized in that the source region and the drain region are produced in a substrate by ion implantation before the application of the metal layer so that the multi-layer structure acts as an implantation mask.

The multi-layer structure of the present invention may be produced by the following steps: Producing a gate oxide layer on the substrate; applying a doped polysilicon layer on the gate oxide layer; applying a diffusion barrier layer of the material of the diffusion barrier structure onto the doped polysilicon layer; depositing a silicon cover layer onto the diffusion barrier layer; and following a photo technique, producing a multi-layer structure by anisotropic re-etching of the silicon cover layer, the diffusion barrier layer and the doped polysilicon layer. This may be further characterized by producing a diffusion barrier layer of TiN, and subjecting the diffusion barrier layer to a temperature treatment before deposing the silicon covering layer. In addition, a surface-wide uniform insulating layer may be produced for manufacturing the spacers, the spacers being formed therefrom by subsequent anisotropic re-etching.

The use of multilayer gate electrodes composed of a polysilicon layer, of a titanium nitride layer, and of a metal silicide layer of a refractory metal in a MOS transistor is known from Patent Abstracts of Japan, Vol. 11, No. 320 (E-552) (2767) Oct. 17, 1987, JPA-62-111466. This reference is directed to preventing the destruction due to diffusion of titanium into the gate oxide. Furthermore, a MOS transistor is not produced in a SALICIDE process.

DESCRIPTION OF THE PREFERRED EMBODIMENTS

FIGS. 1 through 6 show steps of a SALICIDE process for producing a multi-layer gate electrode which suppresses dopant depletion.

Figure 1:
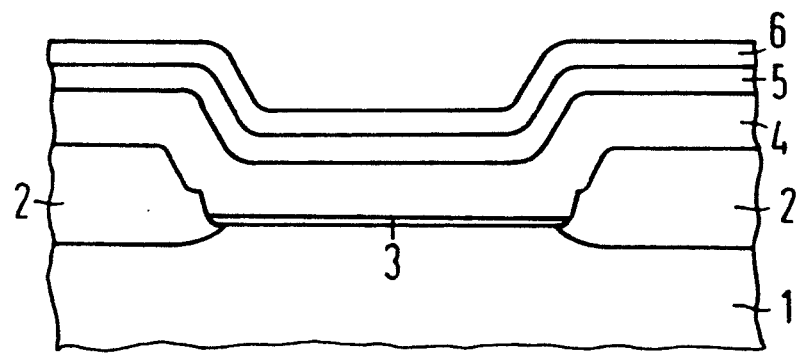
FIG. 1 is a schematic cross section of a multi-layer structure for producing a multi-layer gate electrode using a SALICIDE process in accordance with the principles of the present invention.

In FIG. 1, a substrate 1 of, for example, silicon has field oxide regions 2 and a gate oxide layer 3 applied thereto. The field oxide regions 2 separate the illustrated active region from other active regions (not shown) on the substrate 1. A doped polysilicon layer 4 is deposited surface-wide, or at least area-wide, on the substrate 1. The doped polysilicon layer 4 has a thickness of approximately 300 nm and a doping concentration of $1 \times 10^{20}$ B/cm$^3$. A diffusion barrier layer 5 is produced surface-wide over the doped polysilicon layer 4, the diffusion barrier layer 5 being composed of, for example, TiN and being of a thickness of, for example, 10 through 40 nm. Over the top of the diffusion barrier layer 5 is applied a silicon cover layer 6. This silicon cover layer 6 is either of amorphous or of polycrystalline silicon and has a thickness of approximately 80 through 100 nm.

Figure 2:
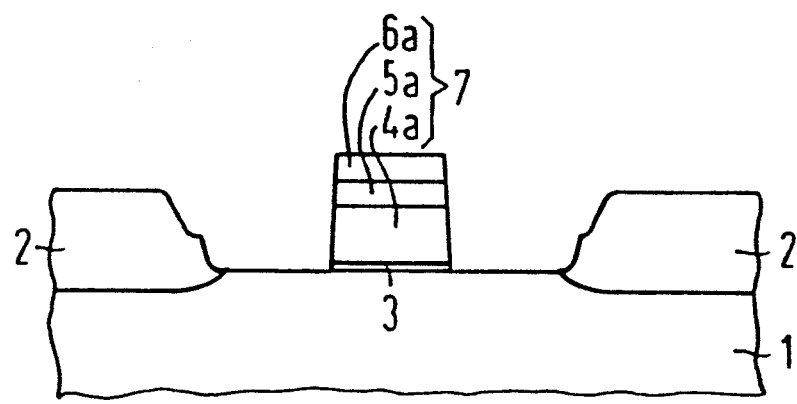
FIG. 2 is the schematic cross section of the structure shown in FIG. 1 after a dry etching process.

With reference to FIG. 2, the silicon cover layer 6, the diffusion barrier layer 5, the doped polysilicon layer 4, and the gate oxide layer 3 are structured, or shaped, in a dry etching process into an appropriate shape for a gate electrode of a MOS transistor. This forms a doped polysilicon structure 4a from the doped polysilicon layer 4, a diffusion barrier structure 5a from the diffusion barrier layer 5, and a silicon structure 6a from the silicon cover layer 6, which together form a multi-layer structure 7.

In the following step shown in FIG. 3, side wall coverings 8 are produced at the side walls of the multi-layer structure 7, the side wall coverings 8 also being referred to as spacers. The spacers 8 are composed of, for example, SiO$_2$ and are produced by conformal deposition of a SiO$_2$ layer and subsequent anisotropic re-etching of the SiO$_2$ layer (although this is not shown in detail) so that the spacers 8 remain.

Figure 3:
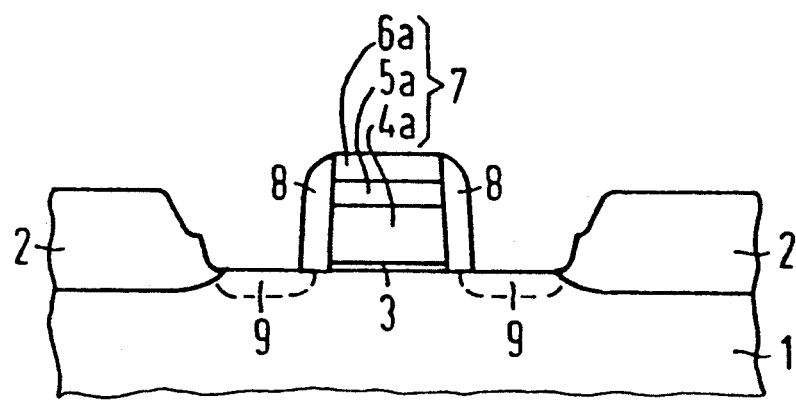
FIG. 3 is the schematic cross section of the structure shown in FIG. 2 after the application of spacers.

Using the multi-layer structure 7 provided with the spacers 8 and the adjoining field oxide regions 2 as a self-aligned mask, source and drain regions 9 are produced by implantation of, for example, arsenic or boron in the exposed areas of the substrate 1, as shown in FIG. 3.

Figure 4:
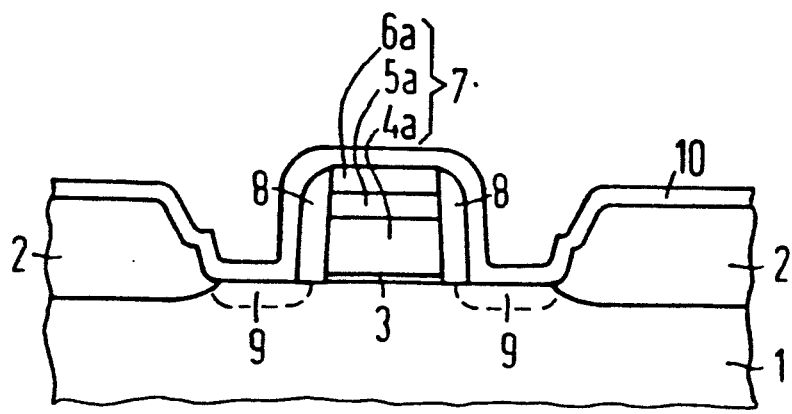
FIG. 4 is the schematic cross section of the structure of FIG. 3 after the application of a metal layer.

In FIG. 4, a metal layer 10 is applied surface-wide, or at least area-wide, onto the surface of the field oxide regions 2, the source and drain regions 9, the spacers 8, and the silicon structure 6a. The metal layer is composed, for example, of titanium and has a thickness of, for example, 40 to 60 nm.

Figure 5:
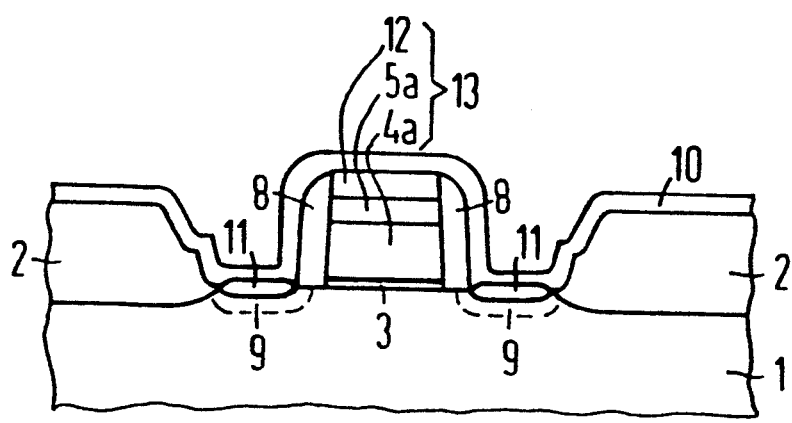
FIG. 5 is the schematic cross section of the structure of FIG. 4 after selective silicide formation.

With reference to FIG. 5, the substrate and the adjoining layers are subjected to a tempering step at, for example, 700° C. which causes selected silicide formation at the boundary surfaces between the metal layer 10 and the silicon of the material. These boundary surfaces are situated at the source and drain regions 9 where the metal layer 10 meets the substrate 1, as well on the silicon structure 6a. Since the silicon structure 6a is to be completely silicidated, to guarantee a complete silicidation of the silicon structure 6a up to the diffusion barrier structure 5a, the metal layer 10 must be sufficiently thick that at least an adequate quantity of the metal is available, and preferably an excess thereof, over the silicon structure 6a. Given a thickness of the silicon structure 6a of, for example, 80 nm, the metal layer 10 of, for example, titanium must have a thickness of at least 40 nm thereover. The tempering step, also referred to as a silicidation step, converts the silicon structure 6a into a metal silicide structure 12. Together with the diffusion barrier structure 5a and the doped polysilicon structure 4a, the metal silicide structure 12 forms a multi-layer gate electrode 13. This tempering step also causes the formation of source and drain terminals 11 of metal silicide at the surfaces of the source and drain regions 9.

Figure 6:
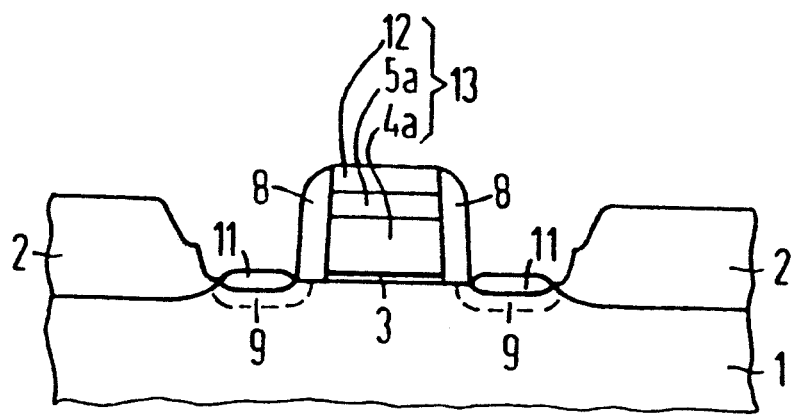
FIG. 6 is the schematic cross section of the structure of FIG. 5 after the removal of the metal layer.

In FIG. 6, the non-reacted metal of the metal layer 10 and potential reaction products are selectively removed relative to the metal silicide structure 12 and the source and drain terminals 11 in an etching process as the final step. This etching is performed with, for example, $NH_4OH/H_2O_2/H_2O$. In a possible further temperature step, the metal silicide of the metal silicide structure 12 and the source and drain terminals 11 is converted into a stable phase to produce the final structure of FIG. 6.

The effectiveness of a diffusion barrier structure of TiN with respect to the dopant depletion of boron was capable of being demonstrated with the assistance of measurements: upon the use of a diffusion barrier structure of TiN, a boron concentration in the doped polysilicon structure that was higher by about on order of magnitude (a factor of 10) than in comparable, doped polysilicon structures without diffusion barrier structures was achieved after a tempering step at 900° C. for 5 minutes in an atmosphere of $N_2$.

Although other modifications and changes may be suggested by those skilled in the art, it is the intention of the inventors to embody within the patent warranted hereon all changes and modifications as reasonably and properly come within the scope of their contribution to the art.

We claim:

1. A method for producing a multi-layer gate electrode containing doped polysilicon and metal silicide in a MOS transistor, comprising the steps of:

producing a multi-layer structure having side walls on a substrate provided with a gate oxide, said multi-layer structure being produced at a location prescribed for a multi-layer gate electrode, said multi-layer structure including a doped polysilicon structure on said substrate, a diffusion barrier structure on said doped polysilicon structure and a silicon structure on said diffusion barrier structure;

producing spacers at said side walls of said multi-layer structure;

applying a metal layer onto said substrate and said multi-layer structure; and producing a metal silicide structure from said metal layer and said silicon structure using a temperature treatment;

wherein said diffusion barrier structure is of a material which prevents diffusion of dopant from said polysilicon structure into said metal silicide structure.

2. A method as claimed in claim 1, wherein said metal layer is applied to simultaneously cover said multi-layer structure and prescribed locations on said substrate for a source terminal and a drain terminal.

3. A method as claimed in claim 2, further comprising the step of:

producing a source region and a drain region in said substrate by ion implantation before said step of applying said metal layer, including using said multi-layer structure as an implantation mask during said ion implantation.

4. A method as claimed in claim 1, wherein said multi-layer structure is produced by the steps of:

producing a gate oxide layer on said substrate;

applying a doped polysilicon layer onto said gate oxide layer;

applying a diffusion barrier layer onto said doped polysilicon layer, said diffusion barrier layer being of a material of said diffusion barrier structure;

depositing a silicon cover layer onto said diffusion barrier layer; and following a photo technique, producing said multi-layer structure by anisotropic re-etching of said silicon cover layer, said diffusion barrier layer and said doped polysilicon layer.

5. A method as claimed in claim 4, wherein said diffusion barrier layer is of TiN and further comprising the step of:

subjecting said diffusion barrier layer to a temperature treatment before said step of depositing said silicon cover layer.

6. A method as claimed in claim 1, wherein said step of producing spacers includes the steps of:

producing a surface wide uniform insulating layer; and forming said spacers by anisotropic re-etching of said insulating layer.

7. A method for producing a multi-layer gate electrode containing doped polysilicon and metal silicide in a MOS transistor, comprising the steps of:

producing a multi-layer structure having side walls on a substrate provided with a gate oxide, said multi-layer structure being produced at a location prescribed for a multi-layer gate electrode, said multi-layer structure including a doped polysilicon structure on said substrate, a diffusion barrier structure on said doped polysilicon structure and a silicon structure on said diffusion barrier structure;

producing spacers at said side walls of said multi-layer structure;

applying a metal layer onto said substrate and said multi-layer structure; and producing a metal silicide structure from said metal layer and said silicon structure using a temperature treatment;

wherein said diffusion barrier structure is of a material which prevents diffusion of dopant from said polysilicon structure into said metal silicide structure, said diffusion barrier structure being composed of TiN.

* * * * *